United States Patent
Eremenko et al.

(10) Patent No.: US 9,823,703 B2
(45) Date of Patent: Nov. 21, 2017

(54) MODULES AND CONNECTIONS FOR MODULES TO COUPLE TO A COMPUTING DEVICE

(71) Applicant: Google Inc., Mountain View, CA (US)

(72) Inventors: Paul Eremenko, Mountain View, CA (US); Ara Knaian, Mountain View, CA (US); Seth Newburg, Mountain View, CA (US); David Fishman, Mountain View, CA (US)

(73) Assignee: Google Inc., Mountain View, CA (US)

( * ) Notice: Subject to any disclaimer, the term of this patent is extended or adjusted under 35 U.S.C. 154(b) by 238 days.

(21) Appl. No.: 14/626,723

(22) Filed: Feb. 19, 2015

(65) Prior Publication Data

US 2015/0277503 A1    Oct. 1, 2015

Related U.S. Application Data

(60) Provisional application No. 61/971,377, filed on Mar. 27, 2014.

(51) Int. Cl.
| | | |
|---|---|---|
| *H05K 7/00* | (2006.01) | |
| *G06F 1/16* | (2006.01) | |
| *H04W 88/02* | (2009.01) | |
| *H04M 1/02* | (2006.01) | |
| *H05K 1/11* | (2006.01) | |

(Continued)

(52) U.S. Cl.
CPC .......... *G06F 1/1658* (2013.01); *G06F 1/1684* (2013.01); *H04M 1/0254* (2013.01); *H04W 88/02* (2013.01); *H04M 1/0274* (2013.01); *H05K 1/144* (2013.01);

(Continued)

(58) Field of Classification Search
CPC ............. H05K 2201/044; H05K 1/144; H05K 2201/041; H05K 2201/042; H05K 2201/043; H05K 2201/045; H05K 1/14; H05K 3/308; H05K 2201/1034; H01R 12/727; H01R 12/72; H01R 12/722; H01R 12/724; H01R 12/725; H01R 23/68; H01R 23/6886; H01R 23/6893; H01R 9/28; H01R 13/659
USPC ....... 361/748, 760, 767, 772, 777, 784, 785, 361/788, 791, 803; 174/535, 541, 549,
(Continued)

(56) References Cited

U.S. PATENT DOCUMENTS

| | | |
|---|---|---|
| 4,658,333 A | 4/1987 | Grimes |
| 4,856,088 A | 8/1989 | Oliwa et al. |

(Continued)

FOREIGN PATENT DOCUMENTS

WO    2013120723 A1    8/2013

OTHER PUBLICATIONS https://youtu.be/oDAw7vW7H0c.

*Primary Examiner* — Binh Tran
(74) *Attorney, Agent, or Firm* — Dority & Manning, P.A.

(57) ABSTRACT

Examples herein include modules and connections for modules to couple to a computing device. An example module includes a housing comprising an end to couple to a computing device, multiple capacitive pads that each include data contacts to enable data transfer, a power contact pad to provide or receive power, and a ground contact pad to couple to ground. The ground contact pad is larger in size than the power contact pad, and the ground contact pad is positioned closer than the power contact pad to the end of the housing configured to couple to the computing device.

19 Claims, 12 Drawing Sheets

(51) Int. Cl.
*H05K 1/14* (2006.01)
*H01L 23/48* (2006.01)

(52) U.S. Cl.
CPC . *H05K 2201/041* (2013.01); *H05K 2201/042* (2013.01); *H05K 2201/043* (2013.01); *H05K 2201/044* (2013.01)

(58) Field of Classification Search
USPC ............. 174/557; 439/43, 47, 48, 325, 377, 439/541.5, 620.15
See application file for complete search history.

(56) References Cited

U.S. PATENT DOCUMENTS

| | | | |
|---|---|---|---|
| 4,904,549 A | 2/1990 | Goodwin et al. | |
| 4,974,317 A | 12/1990 | Rodriguez, II et al. | |
| 5,895,230 A | 4/1999 | Bartley | |
| 5,983,303 A | 11/1999 | Sheafor et al. | |
| 6,038,132 A * | 3/2000 | Tokunaga | H01L 25/105 257/E25.023 |
| 6,862,173 B1 | 3/2005 | Konshak et al. | |
| 6,932,649 B1 * | 8/2005 | Rothermel | H01R 13/6658 439/620.01 |
| 7,458,815 B2 | 12/2008 | Fallah-Adl et al. | |
| 7,509,094 B2 | 3/2009 | Moran et al. | |
| 7,618,260 B2 | 11/2009 | Daniel et al. | |
| 7,953,455 B2 | 5/2011 | Moran et al. | |
| 8,154,244 B1 | 4/2012 | Gorham et al. | |
| 8,180,395 B2 | 5/2012 | Moran et al. | |
| 8,249,656 B2 | 8/2012 | Sherman et al. | |
| 8,285,342 B2 | 10/2012 | Moran et al. | |
| 8,509,848 B1 | 8/2013 | Cole | |
| 2003/0118006 A1 | 6/2003 | Yang et al. | |
| 2004/0212941 A1 | 10/2004 | Haas et al. | |
| 2005/0190124 A1 | 9/2005 | Manabe | |
| 2006/0046568 A1 * | 3/2006 | Consoli | H01R 13/514 439/607.05 |
| 2007/0099593 A1 | 5/2007 | Thome et al. | |
| 2008/0028237 A1 | 1/2008 | Knight | |
| 2008/0168282 A1 | 7/2008 | Brundridge | |
| 2008/0197825 A1 | 8/2008 | Siri | |
| 2008/0224769 A1 | 9/2008 | Markowski et al. | |
| 2009/0124288 A1 | 5/2009 | Song et al. | |
| 2009/0167245 A1 | 7/2009 | Nguyen | |
| 2009/0280865 A1 | 11/2009 | Danis et al. | |
| 2010/0073202 A1 | 3/2010 | Mazed | |
| 2010/0220432 A1 | 9/2010 | Wise et al. | |
| 2010/0302028 A1 | 12/2010 | Desai et al. | |
| 2010/0323238 A1 | 12/2010 | Takahashi et al. | |
| 2011/0157815 A1 | 6/2011 | Lin | |
| 2011/0179405 A1 | 7/2011 | Dicks et al. | |
| 2011/0264944 A1 | 10/2011 | Newman | |
| 2012/0293934 A1 | 11/2012 | Boduch et al. | |
| 2013/0008707 A1 | 1/2013 | Kim | |
| 2013/0026572 A1 | 1/2013 | Kawa et al. | |
| 2013/0103212 A1 | 4/2013 | Andiappan | |
| 2013/0155600 A1 | 6/2013 | Ross et al. | |
| 2014/0009980 A1 | 1/2014 | Divan et al. | |

\* cited by examiner

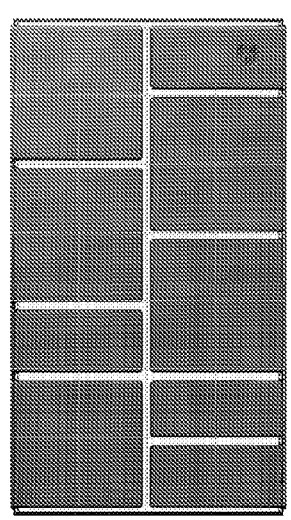 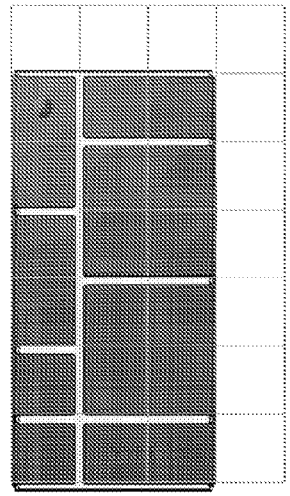 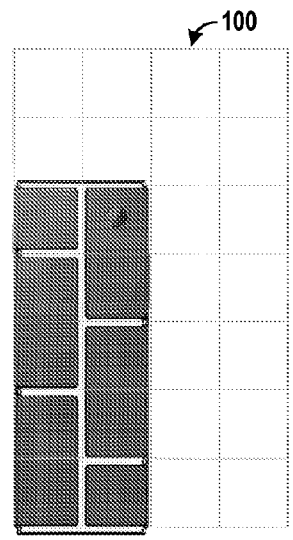
FIG. 1A　　　FIG. 1B　　　FIG. 1C
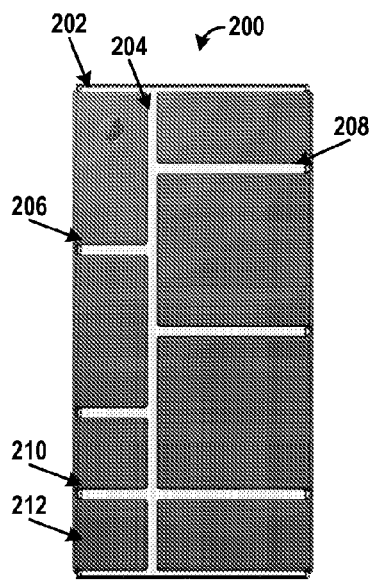 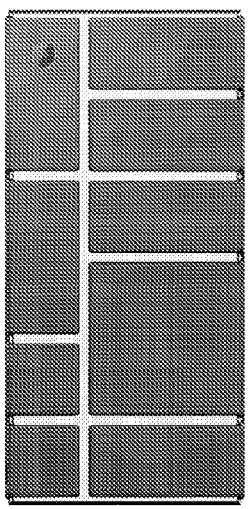 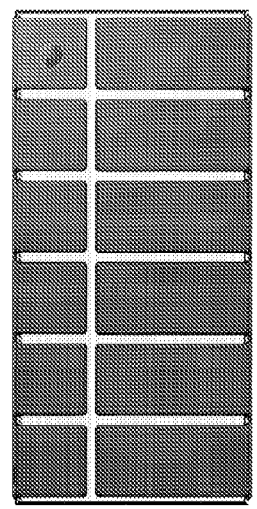
FIG. 2A　　　FIG. 2B　　　FIG. 2C

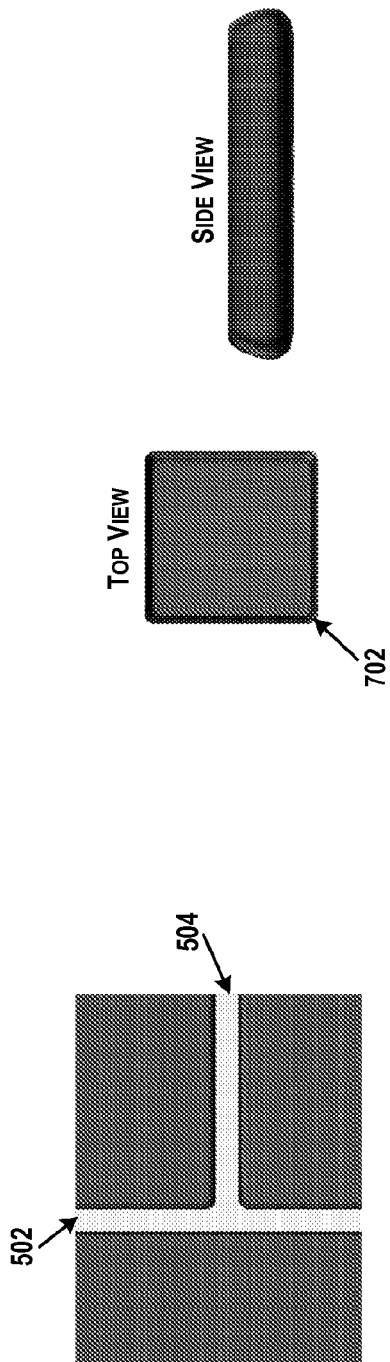
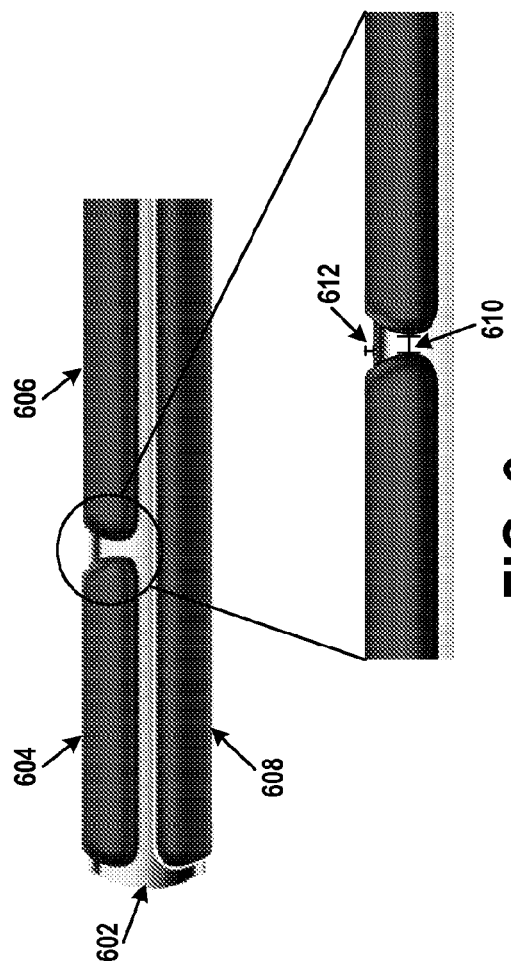
FIG. 7
FIG. 5
FIG. 6

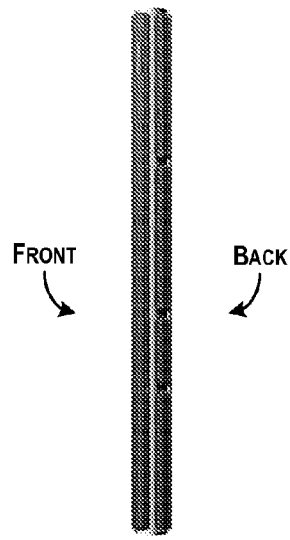
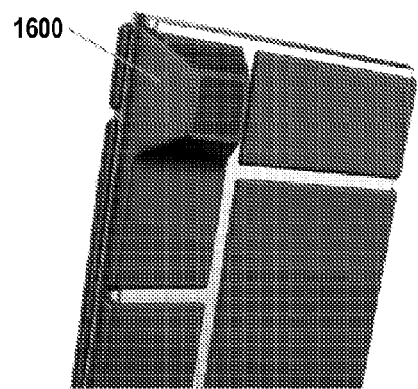
FIG. 15  FIG. 16
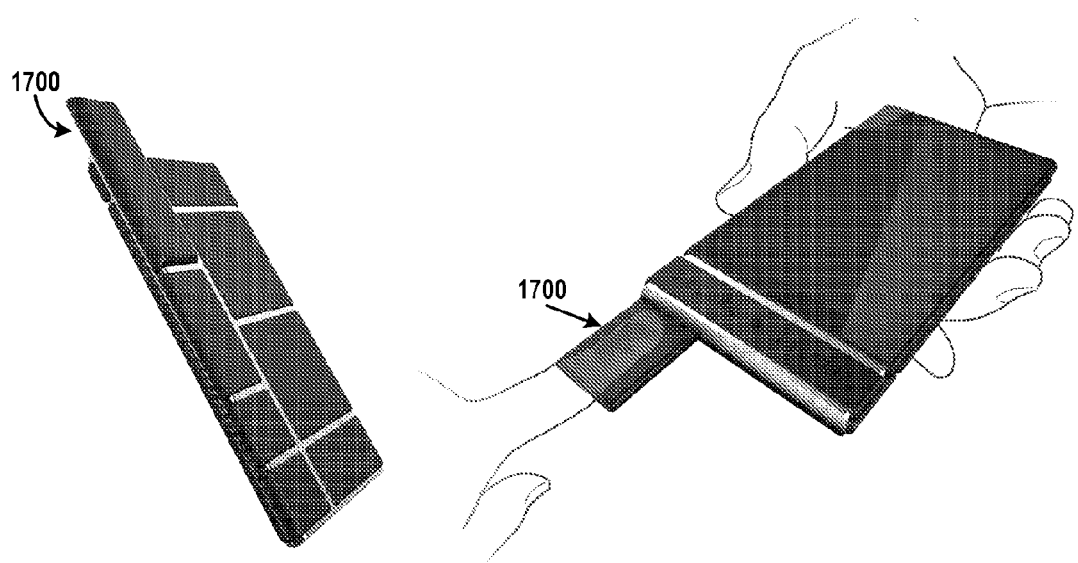
FIG. 17A  FIG. 17B

EP MAGNET ACTUATES SPRING
PIN WHICH HOLDS MEDIA BAR

MODULES AND CONNECTIONS FOR MODULES TO COUPLE TO A COMPUTING DEVICE

CROSS REFERENCE TO RELATED APPLICATION

The present disclosure claims priority to U.S. provisional patent application Ser. No. 61/971,377 filed on Mar. 27, 2014, which is incorporated in its entirety by this reference.

BACKGROUND

Unless otherwise indicated herein, the materials described in this section are not prior art to the claims in this application and are not admitted to be prior art by inclusion in this section.

There are many types of mobile devices today. Some devices are telephones that may provide basic telephone features, and may be referred to as a feature phone. Other devices may be configured to provide more functionality, and may be referred to as a smartphone. As one example, a smartphone or smart phone, may be a mobile phone configured to operate according to a mobile operating system, and generally provide more advanced computing capability and connectivity than a feature phone. Many smartphones combine functions of a personal digital assistant (PDA) with a mobile phone. Some smart phones add functionality of portable media players, compact digital cameras, pocket video cameras, GPS navigation units, etc., to form one multi-use device.

Typical phones (either smartphones or feature phones) include multiple internal hardware components enclosed within a housing including a battery, and a display.

SUMMARY

Within examples, modules and connections for modules to couple to a computing device are provided. An example module includes a housing comprising an insertion contact surface to couple to a computing device, multiple capacitive pads that each include data contacts to enable data transfer, a power contact pad to provide or receive power, and a ground contact pad to couple to ground. The ground contact pad is larger in size than the power contact pad. In some further examples, the ground contact pad is positioned closer than the power contact pad to the insertion contact surface of the housing to couple to the computing device.

In another example, a module comprises a first interface block comprising multiple capacitive pads that each capacitive pad include data contacts to enable data transfer, a power contact pad to provide or receive power, and a ground contact pad to couple to ground. The ground contact pad is larger in size than the power contact pad, and the multiple capacitive pads, the power contact pad, and the ground contact pad are configured in rows. The power contact pad is in a corner and the ground contact pad is in another corner diagonal and across from the power contact pad. The module also includes a second interface block comprising multiple capacitive pads that each capacitive pad include data contacts to enable data transfer, a power contact pad to provide or receive power, and a ground contact pad to couple to ground.

In another example, a computing device is provided that comprises a plurality of slots to receive modules, and an interface block within slots of the plurality of slots. The interface block includes a power contact to provide power to a respective module and a ground contact to couple ground to the respective module. The computing device also includes a plurality of removable modules to be positioned into the plurality of slots, and a respective removable module includes a module interface block to couple to the interface block within a respective slot. The module interface block includes a power contact pad and a ground contact pad, and the power contact pad and the ground contact pad are positioned such that insertion of the respective removable module into the respective slot causes the ground contact pad to contact to the ground contact first and then the power contact pad to contact to the power contact.

Many of the described components and functions of the examples herein may be divided up into additional functional or physical components, or combined into fewer functional or physical components. In some further examples, additional functional and/or physical components may be added to the examples as well. As a specific example, internal components of a module may comprise multiple components or be configured to perform multiple functions, some of which may be combined in certain applications.

These as well as other aspects, advantages, and alternatives, will become apparent to those of ordinary skill in the art by reading the following detailed description, with reference where appropriate to the accompanying figures.

BRIEF DESCRIPTION OF THE FIGURES

FIGS. 1A-1C illustrate example configurations for a computing device.

FIGS. 2A-2C illustrate example arrangements of rails in a computing device.

FIG. 5 illustrates a portion of a device, which may be any of the devices shown in FIGS. 1-4.

FIG. 6 illustrates a side view of a portion of a device, which may be any of the devices shown in FIGS. 1-4.

FIG. 7 illustrates a top and side view of a module.

FIG. 15 illustrates a side view of an example device in which modules have been inserted.

FIG. 16 illustrates a portion of an example device in which a module exceeds a thickness dimension of the device.

FIGS. 17A-17B illustrate an example device in which a module exceeds a length dimension of the device.

DETAILED DESCRIPTION

Figures 3A, 3B, 3C:
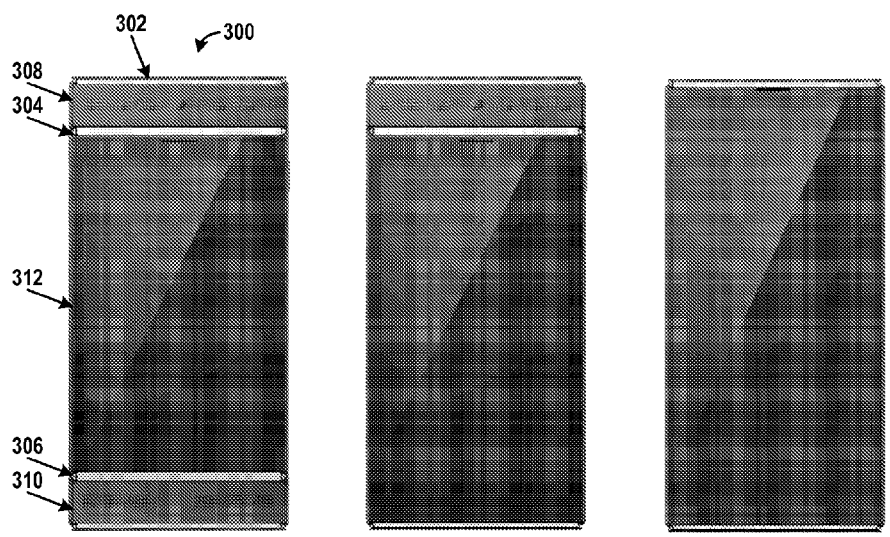
FIGS. 3A-3C illustrate a front view of example configurations of a device.

The following detailed description describes various features and functions of the disclosed systems and methods with reference to the accompanying figures. In the figures, similar symbols identify similar components, unless context dictates otherwise. The illustrative system and method embodiments described herein are not meant to be limiting. It may be readily understood that certain aspects of the disclosed systems and methods can be arranged and combined in a wide variety of different configurations, all of which are contemplated herein.

Within examples, a computing device is provided that includes a backplane configured to receive user-removable modules that may be positioned into slots in the backplane. In one example, the device may be a mobile telephone, and the modules may contain various parts of a mobile phone. The backplane allows for power transfer and communications between the modules, and also holds the module together into an integral device without the need for an enclosure or a housing physically surrounding the modules, for example. The backplane may include a switch (e.g., Unipro switch, PCIe switch, USB hub) that directs incoming data packets from modules to an appropriate output port, power switches on each power port to enable reset or shutdown of modules, and current-monitoring or current-limiting circuitry on each power port to limit inflows and outflows of power. The backplane may optionally include a button to engage or disengage all locking mechanisms of the modules to enable removable or locking of the modules, and the backplane may also optionally include an indicator LED to provide status information.

Referring now to the figures, FIGS. 1A-1C illustrate example configurations for a computing device. The computing device may take the form of a mobile telephone, a tablet computer, a digital music player, or any other general purpose computing device. The configurations shown in FIGS. 1A-1C are of three different size computing devices. A configuration of the devices is based on a grid system 100, and each device comprises a portion of space of the grid 100. For example, the large configuration shown in FIG. 1A comprises a 4×7 portion of the grid 100, the medium configuration shown in FIG. 1B comprises a 3×6 portion of the grid 100, and the small configuration shown in FIG. 1C comprises a 2×5 portion of the grid 100.

The grid 100 may be any number of cells, and in the example shown in FIG. 1A, a maximum grid size may be 4×7. Each cell of the grid 100 may be multiple sizes, and one example includes 20 mm×20 mm.

Each device shown in FIGS. 1A-1C is configured to hold a number of modules. A number, size, and orientation of modules for each device is based on an arrangement of rails in on a backplane of the devices. Thus, a parceling of the devices into same size cells of the grid 100 may enable modules to be used in all sizes of the devices, such that some modules may be used in multiple configurations of the device. Example module sizes include a 1×1 (e.g., 20×20 mm), a 1×2 (e.g., 20×43 mm), and a 2×2 (e.g., 43×43 mm). In some examples, however, some module sizes may only be used within some device configurations due to size of the modules or a configuration of the device.

FIGS. 2A-2C illustrate example arrangements of rails in a computing device 200. The computing device 200 may include a backplane 202 onto which rails are formed. For example, in FIG. 2A, the device 200 is shown with multiple rails, one of which is a spine 204 that extends along a length of the device 200. Other rails include ribs 206, 208 and 210 that are positioned perpendicular to the spine 204. Some rails, such as the ribs 206 and 208, extend from the spine 204 to a perimeter of the device 200, while other rails, such as rail 210, may extend across a width of the device 200. Within examples, the rails provide structural strength for the device 200 along a length and width of the device 200.

FIGS. 2B and 2C illustrate additional example configurations of rails in which more ribs may be provided, and more ribs may extend across a width of the device 200. The rails may form slots into which modules, such as module 212, may be inserted. A number and configuration of the rails on the backplane 202 may dictate a number of slots, and thus, number of modules that the device 200 can accommodate. For example, the device 200 in FIG. 2A is configured to accommodate up to eight modules, a device as shown in FIG. 2B is configured to accommodate up to nine modules, and a device as shown in FIG. 2C is configured to accommodate up to twelve modules. In some examples, slots that are formed by the rails may also secure the modules in the Z dimension.

FIGS. 1A-1C and FIGS. 2A-2C illustrate a back view of the device in multiple example configurations.

FIGS. 3A-3C illustrate a front view of example configurations of a device 300. In FIG. 3A, the device 300 is shown to include a backplane 302 onto which rails 304 and 306 are formed. Each of rails 304 and 306 extend across a width of the device 300 and segment a front of the device 300 into separate areas for separate modules. For example, a top and bottom portion of the device 300 includes modules 308 and 310, and a center section includes module 312 which may be a display module. In the examples shown in FIGS. 3A-3C, the front of the backplane 302 does not include a spine or any rail that extends along a length of the device 300 to enable the center section to include an uninterrupted area for the display module 312, for example. In other examples, however, the front of the backplane 302 may include a spine (not shown), or may otherwise be configured similarly to a back of the backplane as shown in any of FIGS. 1A-1C and FIGS. 2A-2C.

FIG. 3B illustrates a front view of another example configuration of a device. In FIG. 3B, there is one rails at a top area of the device to segment the device into two portions. FIG. 3C illustrates a front view of yet another example configuration of a device. In FIG. 3C, there are no rails on the front of the backplane, and thus, an entirety of the front of the device may include a display module, for example.

Figure 4A:
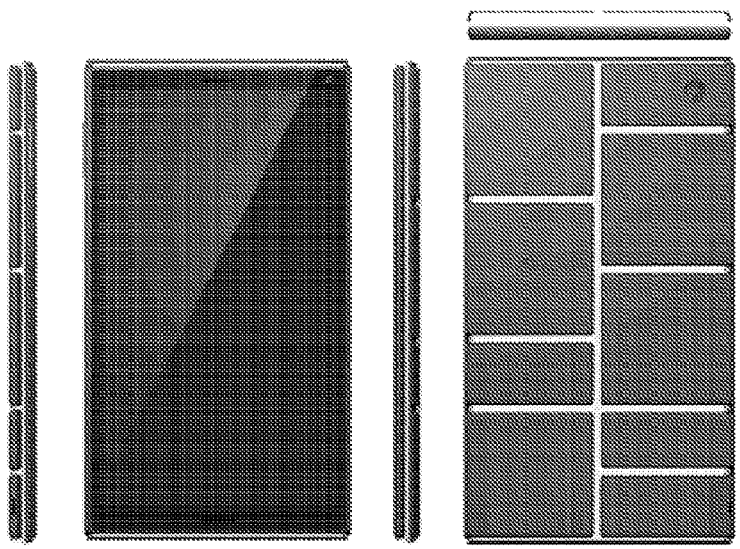
FIGS. 4A-4C illustrate example side, front, and back views of example configurations of a device.
Figure 4B:
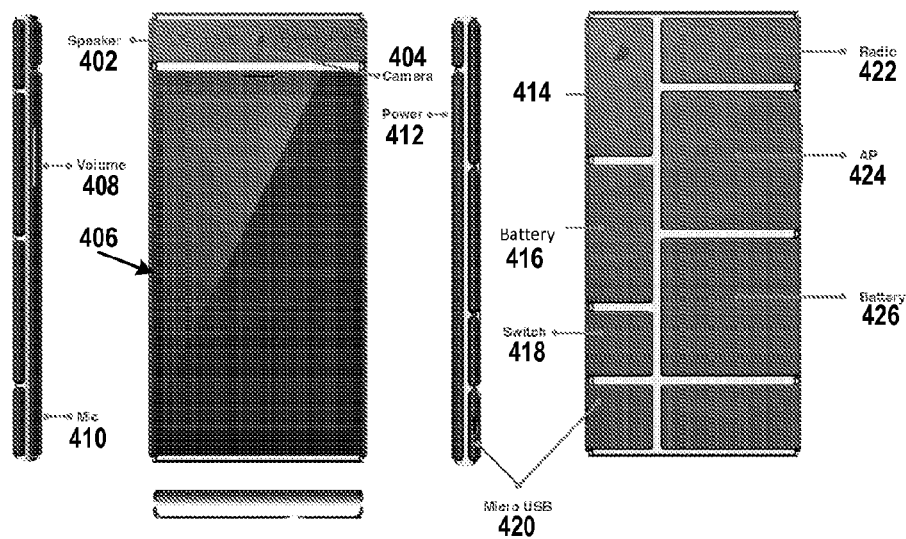
Figure 4C:
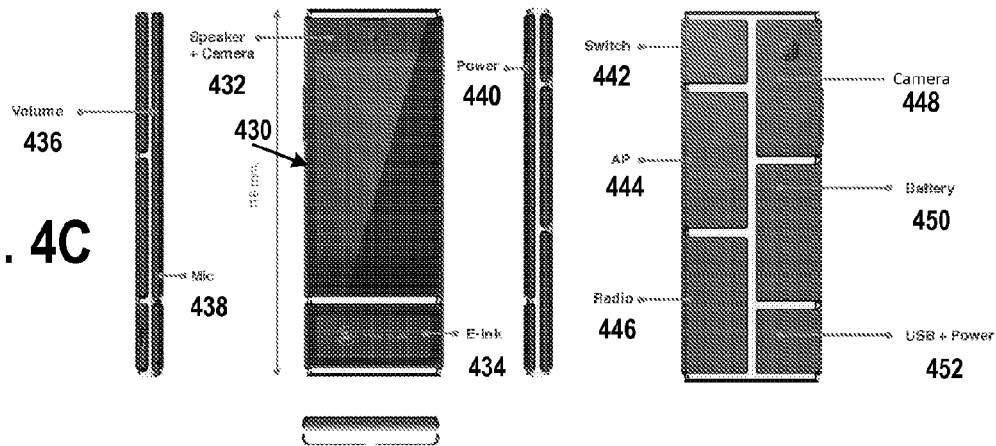

FIGS. 4A-4C illustrate example side, front, and back views of example configurations of a device. FIG. 4A illustrates a large configuration of a device, which may have overall dimensions of 164 mm×91 mm×9 mm, for example. The large configuration may be configured to accommodate up to ten customizable modules, and may have a single front-facing display module slot, and nine rear-facing module slots. In some configurations, the large device may be configured to accommodate fourteen 1×2 modules, and a front side may support four modules rather than a single display.

FIG. 4B illustrates a medium configuration of a device, which may have overall dimensions of 141 mm×68 mm×9 mm, for example. The medium configuration may be configured to accommodate up to ten customizable modules, and may have two (or three) front-facing module slots for a display module and other modules (e.g., a media/E-Ink module), and six rear-facing module slots. In other examples, the medium device may be configured to support twelve modules (e.g., six 1×2 modules and six 1×1 modules), and four front side modules. In FIG. 4B, some example modules are shown on a front side of the device including a speaker module 402 that may include a camera 404, a display module 406 that may include volume buttons 408 and a microphone 410 on a side portion of the display module 406 as well as a power button 412 on another side of the display module 406. Additional example modules are shown on a back side of the device including a module 414 (e.g., configured to have any function side as additional cameras, LED lighting, etc.), a battery module 416, a switch 418, a micro USB 420, a radio 422 (e.g., including antenna), an application processor (AP) 424, and another battery 426. Such modules are examples only, and many other types of modules or modules configured to provide or perform alternate or additional functionality may be included.

FIG. 4C illustrates a small configuration of a device, which may have overall dimensions of 118 mm×45 mm×9 mm, for example. The small configuration may be configured to accommodate up to eight customizable modules, and may have two front-facing module slots for a display module 430 (which may include a speaker and camera 432) and a media/E-Ink module 434, and six rear-facing module slots. The display module 430 may include volume buttons 436 and a microphone 438 on a side of the display module 430, and a power button 440 on another side of the display module 430. In FIG. 4C, some example modules are shown on a back side of the device including a switch 442, an application processor (AP) 444, a radio 446, a camera module 448, a battery module 450, and a USB and power module 452. In other examples, the small device may include ten backside modules (e.g., 1×1 modules) and four frontside modules.

The slots within the example configurations shown in FIGS. 4A-4C may be of same shapes and sizes to allow for universal use of modules across multiple configurations. For example, the medium and large configurations may accept all types of modules, while the small configuration may accept 1×1 and 1×2 modules. However, in some example configurations, the large device may not accept 1×1 modules.

FIG. 5 illustrates a portion of a device, which may be any of the devices shown in FIGS. 1-4. The portion in FIG. 5 illustrates rails of a backplane including rails 502 and 504. Each of the rails 502 and 504 may be 2.5 mm in width, for example.

FIG. 6 illustrates a side view of a portion of a device, which may be any of the devices shown in FIGS. 1-4. In FIG. 6, a backplane 602 is illustrated, and a back side of the back plane includes modules 604 and 606, and a front side of the back plane includes a module 608. A thickness of each of the modules may be 4 mm, and a thickness or spacing between the modules may be 1.5 mm, for a total thickness of the device of about 9.5 mm, for example. In FIG. 6, a magnified view of a portion of the device is shown to illustrate a distance 610 between the modules of 1 mm and to illustrate that the backplane 602 sits a distance 612 of about 0.5 mm below a surface of the modules, for example.

FIG. 7 illustrates a top and side view of a module. As shown in FIG. 7, the module has a curved corner of about 1.5 mm radius and is a continuous section all around. In some examples, curvature of the modules enables the rails to provide structural constraints to hold the modules into the frame from a normal direction. The curvature may be more pronounced at a top than a bottom of the module. The continuous section all around the modules allows for the 1×2 module to be rotated from a horizontal to a vertical orientation and still be held by a section profile of the module in the normal direction.

Figure 8A:
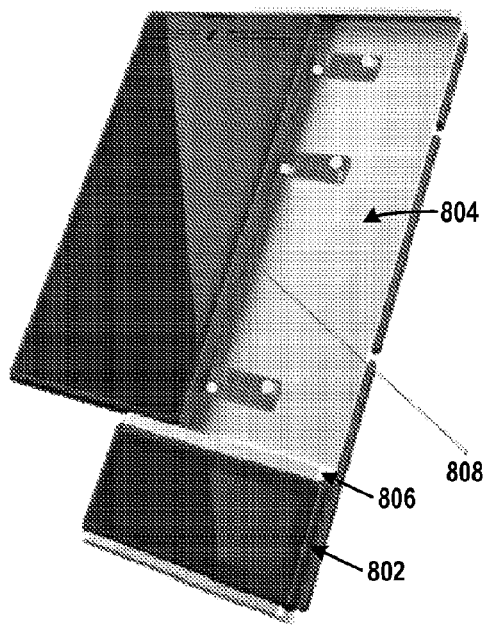
FIGS. 8A-8B illustrate a front side of a device.
Figure 8B:
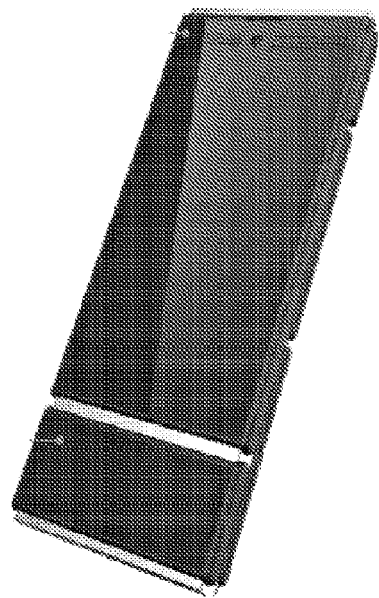

FIGS. 8A-8B illustrate a front side of a device. The front side includes two slots 802 and 804 divided by a rail 806. A display module 808 may slide into the slot 804, and another module (e.g., an e-ink display) may slide into the slot 802. FIG. 8B illustrates the device with the modules fully inserted into the slots.

Figure 9A:
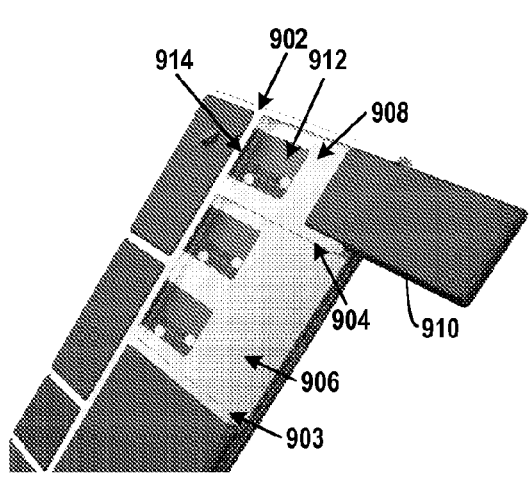
FIG. 9A illustrates a back side of a device.

FIG. 9A illustrates a back side of a device. The back side includes multiple slots defined by rails, such as a spine 902 and a rib 904. Example slots include slots 906 and 908. In FIG. 9A, the back side is shown to include multiple modules as well, such as module 910, which slides into the slot 908. The slots include interface blocks, such as interface block 912, which couples with an interface block on an underside of the module 910. The interface block includes a power contact (e.g., power pins) configured to provide power to the module 910 and data interfaces (e.g., a capacitive pad) configured to enable data transfer between modules. The power contact may be configured to provide power to the module 910, or to receive power from the module 910 (e.g., a module may be configured to generate power, such as through use of inductive charging coils, photovoltaics, hand-crank generators, and fuel cells). The data interface may be configured to transfer data using capacitive pads, or through use of current conduction as well. In further examples, the data interface may be configured to transfer data using an optical interface (e.g., laser diode/photodiode pair), a high-frequency (e.g., 60 GHz) RF, or near-field magnetic communications as well.

The slots further include a metal insert, such as metal insert 914 (or metal portion), which is configured to secure the module 910 within the slot 908 via a received magnetic force. For example, the spine 902 may form a portion of each slot, and the metal insert 914 for each slot may be included in a portion of the spine 902 forms at positions on the spine 902 corresponding to the portion of the slots. The metal insert 914 may be flush with the spine 902. In some examples, the backplane or spine 902 may comprise a metal, such as steel or another soft magnetic material, and the metal insert 914 may be unnecessary since the spine 902 comprises a magnetic material. Thus, the metal insert 914 may be replaced by a metal portion within the spine 902, or the spine 902 itself may comprise a metal portion within the slot 908, for example.

The spine 902 and the rib 904, as well as other rails of the device, may include grooves 903 configured to enable modules to slide into respective slots due to a rounded configuration of the modules (e.g., as shown in the side view in FIG. 7). In other examples, the slots may include indents that are configured to secure the modules within the slots by receiving a corresponding protrusion of the modules.

Figure 9B:
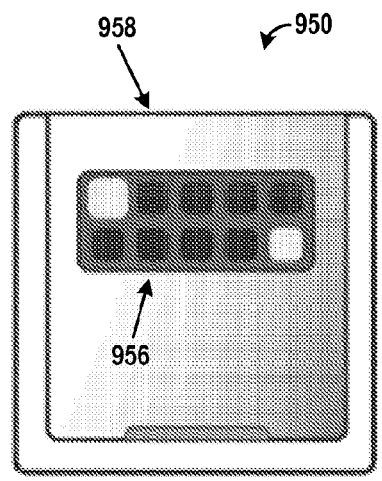
FIG. 9B illustrates a bottom view of example modules.

FIG. 9B illustrates a bottom view of an example module 950. The module 950 may be a 1×1 module (e.g., configured to fit into a slot having a size of 1×1 in the grid as shown in FIGS. 1A-1C, for example). The module 950 includes an interface block 956 on the module 950 including capacitive pads, ground and power pads (described in more detail below).

In addition, the module 950 includes an electro-permanent magnet 958. The module 950 is configured to slide into slots on the device such that the interface block 956 of the module couples to an interface block in the slots, and such that the electro-permanent magnet 958 of the module 950 secures to the metal inserts in the slots, for example, as described more fully below. Modules may further include pins (for power) and data transfer pads (e.g., capacitive pads, inductive coils, or optical transceivers) for data transfer, or may include data pins for power and data transfer, as described more fully below.

Figure 10A:
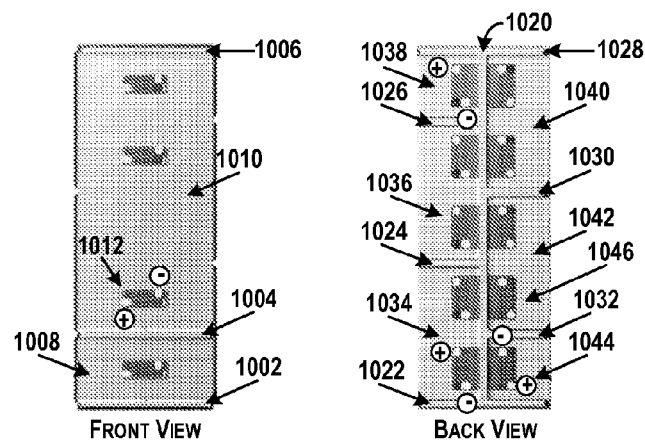
FIGS. 10A-10C illustrate front and back views of example configurations of a backplane of a device with no modules installed.
Figure 10B:
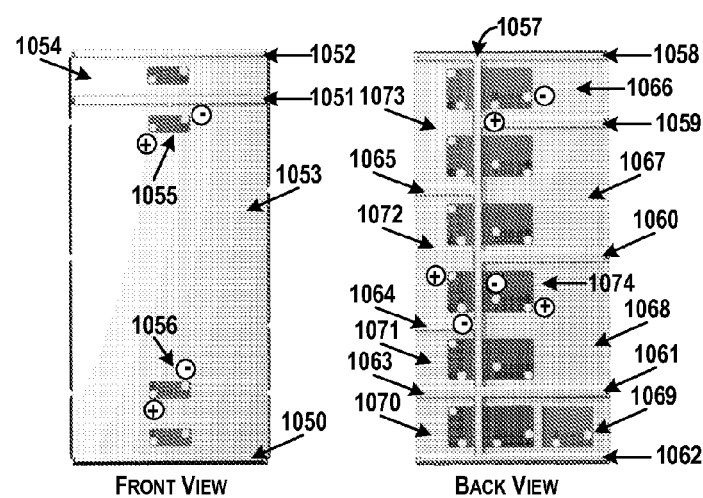
Figure 10C:
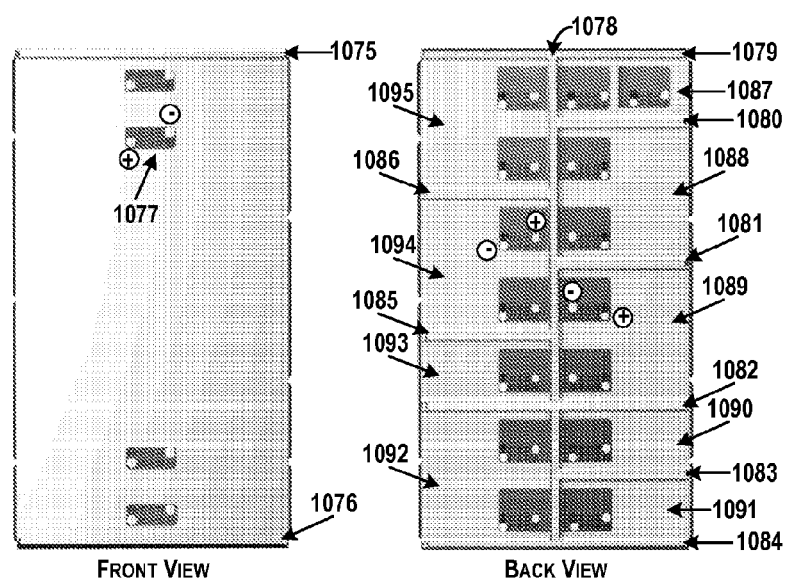

FIGS. 10A-10C illustrate front and back views of example configurations of a backplane of a device with no modules installed. In the front view of FIG. 10A, a small configuration of a backplane is shown that includes three cross rails 1002, 1004, and 1006 that form two slots 1008 and 1010. Each slot includes an interface block, such as interface block 1012, arranged in a horizontal manner. The interface block 1012 includes power contacts labeled as positive and negative polarity. In the front view example configuration, a positive polarity is on a left and a negative polarity is on a right. The interface block 1012 also includes other capacitive pads to enable data transfer.

In the back view of FIG. 10A, the backplane includes a spine 1020, and a number or cross rails 1022, 1024, 1026, 1028, 1030, and 1032, which together form a number of slots 1034, 1036, 1038, 1040, 1042, and 1044. As shown some slots (e.g., slots 1038 and 1044) are square slots or 1×1 slots, and other slots (e.g., slots 1034, 1036, 1040, and 1042) are rectangular slots or 1×2 slots. Each of the slots includes an interface block, such as interface block 1046, arranged in a vertical manner. For interface blocks on a left side of the device, power contacts are positioned such that negative polarity is on bottom and positive polarity is on top. For interface block 1046 arranged vertically on a right side of the device, power contacts are positioned such that a positive polarity is on bottom and a negative polarity is on top. In the back view of FIG. 10A, the interface blocks are shown to be mirrored in placement from left to right (with polarity reversed) to enable a 1×2 module to be used in the small configuration device, and also to be used in the medium or large configuration device by rotating the 1×2 module and lining up pads on a bottom of the 1×2 module with those on the device appropriately. In addition, a 1×1 module may be used on either a left or right side of the device by rotating the 1×1 module 180 degrees to have polarity lined up appropriately.

In the front view of FIG. 10B, a medium configuration of a backplane is shown that includes three cross rails 1050, 1051, and 1052 that form two slots 1053 and 1054. Each slot includes an interface block, such as interface block 1055, arranged in a horizontal manner. The interface block 1056 includes power contacts labeled as positive and negative polarity. In the front view example configuration, a positive polarity is on a left and a negative polarity is on a right. The interface block 1055 also includes other capacitive pads to enable data transfer. Other interface blocks may be provided or power contacts may be positioned at other locations of the interface blocks.

In the back view of FIG. 10B, the backplane includes a spine 1057, and a number or cross rails 1058, 1059, 1060, 1061, 1062, 1063, 1064, 1065, which together form a number of slots 1066, 1067, 1068, 1069, 1070, 1071, 1072, and 1073. As shown some slots (e.g., slots 1070 and 1071) are square slots or 1×1 slots, some slots (e.g., slots 1066, 1069, 1072, and 1073) are rectangular slots or 1×2 slots, and other slots (e.g., slots 1067 and 1068) are square slots or 2×2 slots. Each of the slots includes an interface block, such as interface block 1074. Slots on a right side of the backplane include interface blocks arranged in a horizontal manner such that polarity of the power pins has a positive polarity to the right and a negative polarity to the left. Slots on a left side of the backplane include interface blocks arranged in a vertical manner such that polarity of the power pins has a positive polarity on top and a negative polarity on bottom. Some slots may include multiple interface blocks, such as slot 1068, for example.

In addition, in the back view of FIG. 10B, some slots are shown to include multiple interface blocks within a given slot. For example, larger slots such as slots 1067 and 1068 include two interface blocks that may couple with multiple interface blocks of larger modules to enable additional data transfer. However, not all interface blocks within a given slot, or all capacitive data pads of the interface blocks, may be used at all times.

In the front view of FIG. 10C, a large configuration of a backplane is shown that includes two cross rails 1075 and 1076 that form a slot that includes multiple interface blocks, such as interface block 1077, arranged in a horizontal manner. The interface block 1077 includes power contacts labeled as positive and negative polarity. In the front view example configuration, a positive polarity is on a left and a negative polarity is on a right. The interface block 1077 also includes other capacitive pads to enable data transfer. Other interface blocks may be provided as well with power contacts positioned at other areas.

In the back view of FIG. 10C, the backplane includes a spine 1078, and a number or cross rails 1079, 1080, 1081, 1082, 1083, 1084, 1085, 1086, which together form a number of slots 1087, 1088, 1089, 1090, 1091, 1092, 1093, 1094, and 1095. As shown some slots (e.g., slots 1087, 1090, 1091, and 1093) are rectangular slots or 1×2 slots, and other slots (e.g., slots 1088, 1089, 1092, 1094, and 1095) are square slots or 2×2 slots. Each of the slots includes an interface block. Slots on a right side of the backplane include interface blocks arranged in a horizontal manner such that polarity of the power pins has a positive polarity to the right and a negative polarity to the left. Slots on a left side of the backplane include interface blocks arranged such that polarity of the power pins has an opposite configuration.

Figure 11:
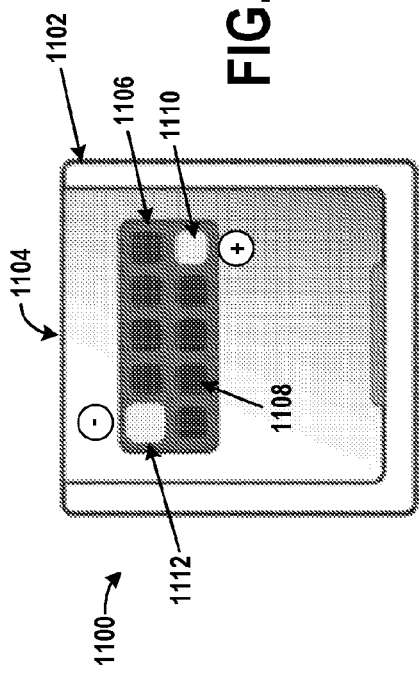
FIG. 11 illustrates a 1×1 module, for example, which includes an interface block arranged in a square format.

FIGS. 11-13 illustrate other example configurations of removable modules. FIG. 11 illustrates a 1×1 module 1100, for example, which includes an interface block 1102. The module 1100 includes a housing 1102 that has an insertion contact surface 1104 to couple to a computing device and a perimeter structure with an opening. The opening may be at the insertion contact surface 1104 to enable the insertion contact surface 1104 of the module 1100 to slide into a slot of a computing device, for example. The insertion contact surface 1104 may be at a boundary of the module 1100 to enable the module 1100 to couple to a slot of a computing device.

The module 1100 also includes an interface block 1106 provided adjacent the opening, and on which multiple capacitive pads 1108, a power contact pad 1110, and a ground contact pad 1112 are provided. The multiple capacitive pads 1108 include data contacts to enable data transfer. The power contact pad 1110 provides or receives power to the module 1100, and the ground contact pad 1112 couples to ground. The interface block 1106 is shown to include eight capacitive pads configured for data transfer, however, more or fewer may be included. The interface block 1106 is arranged along a length of the module 1100, and since the module 1100 is square, the interface block 1102 may be considered arranged vertically or horizontally depending upon a position of the module 1100.

FIG. 11 illustrates the ground contact 1112 to be larger in size than the power contact pad 1110, and also the ground contact pad 1112 is positioned closer than the power contact pad 1110 to the insertion contact surface 1104 of the housing 11102 configured to couple to the computing device. The size and configuration of the ground contact pad 1112 and the power contact pad 1110 are selected to enable the ground contact pad 1112 to connect first before the power contact pad 1110 and to disconnect last (described more fully below with reference to FIG. 14).

In one example, the ground contact pad 1112 may have a size larger than the power contact pad 1110. An amount larger may be related to the size of the capacitive pads 1108 or the power contact pad 1110. For example, the amount larger may be about half a radius larger in size, or as another example about 10% larger in size. The amount larger may be anywhere between about 5% to about 50% depending on a size of the interface block 1106, for example. By providing the ground contact pad 1112 larger than the power contact pad 1110, during insertion of the module 1100, the ground contact pad 1112 will contact to a corresponding ground before the power contact pad 1110 contacts to a corresponding power so that the module 1100 is grounded first.

In the example module 1110, there are ten total pads arranged in rows and columns, or as a 2×5 arrangement. Two of the corners include the ground contact pad 1112 and the power contact pad 1110. Thus, the ground contact pad 1112 and the power contact pad 1110 are arranged in opposite corners. In the example shown in FIG. 11, the multiple capacitive pads 1108, the power contact pad 1110, and the ground contact pad 1112 are configured in rows, and the power contact pad 1110 is positioned at a corner. The ground contact pad 1112 is in another corner diagonal and across from the power contact pad 1110.

The housing 1102 has a top side and a bottom side, and a surface of the bottom side includes the interface block 1106 and is for coupling to the computing device. Thus, as the module 1100 is slide into a slot on the computing device, the surface of the bottom of side of the module 1100 may contact a corresponding interface block of the computing device.

Figures 12A, 12B:
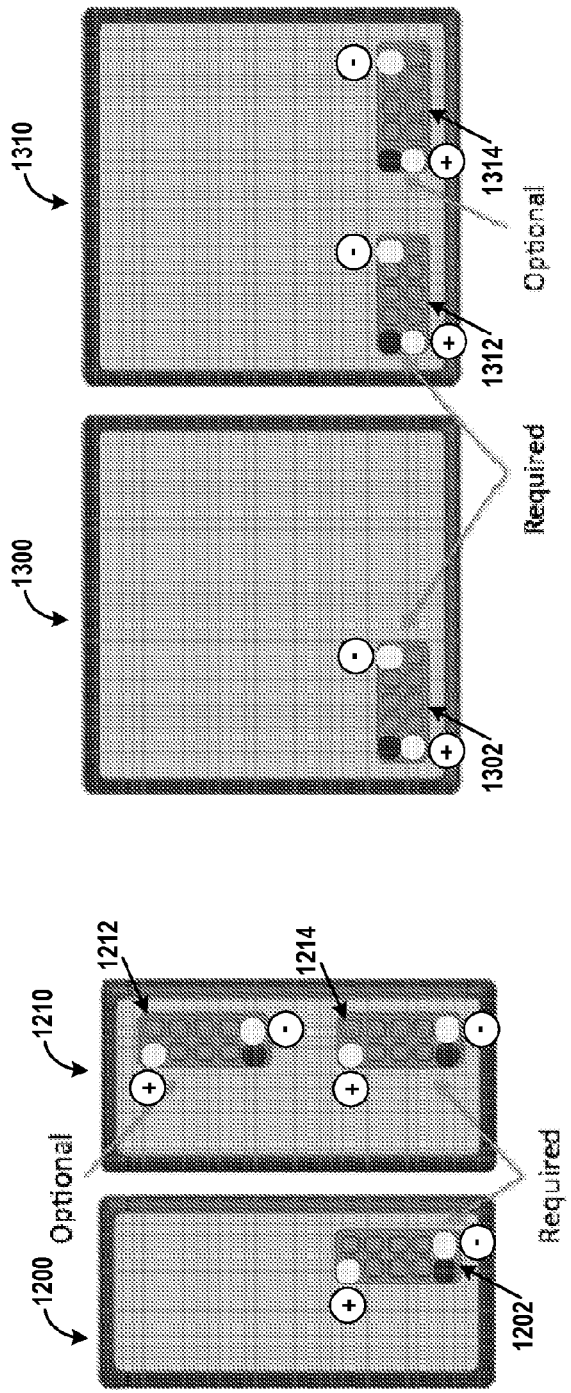
FIG. 12A illustrates an example configuration of a removable module in a rectangular format.
FIG. 12B illustrates another example configuration of a removable module in a rectangular format.

FIG. 12A illustrates an example configuration of a removable module 1200 in a rectangular format. The module 1200 includes an interface block 1202 arranged in a vertical manner. FIG. 12B illustrates another example configuration of a removable module 1210 in a rectangular format. The module 1210 includes two interface blocks 1212 and 1214 arranged vertically. For the rectangular module shown in FIGS. 12A-12B, one interface block may be required to provide electrical connectivity to and from the modules. The arrangement shown in FIG. 12B illustrates an optional configuration in which two interface blocks may be provided for additional functionality depending upon details of the electronics of the module 1210, for example. Each interface block may include multiple capacitive pads, a power contact pad, and a ground contact pad as shown, and the ground contact pad may be larger in size than the power contact pad (similar to the design shown in FIG. 11).

In FIGS. 12A-12B, the interface blocks 1212 and 1214 are configured in a stacked configuration such that respective capacitive pads, power contact pads, and ground contact pads are in rows and columns, and the power (positive) contact pads of the interface blocks 1212 and 1214 are in the same column. Similarly, the ground contacts pads of the interface blocks 1212 and 1214 are in the same column.

In FIGS. 12A-12B, interface blocks are described as being arranged vertically on the modules, however, such an arrangement may be dependent upon how the module is positioned. The modules 1200 and 1210 are rectangular, and the interface blocks are positioned along a length of the rectangle or along a long-edge side of the rectangle, for example. In some examples, due to a configuration and arrangement of the interface block 1202, the module 1200 may be positioned vertically or horizontally into a backplane.

Figures 13A, 13B:
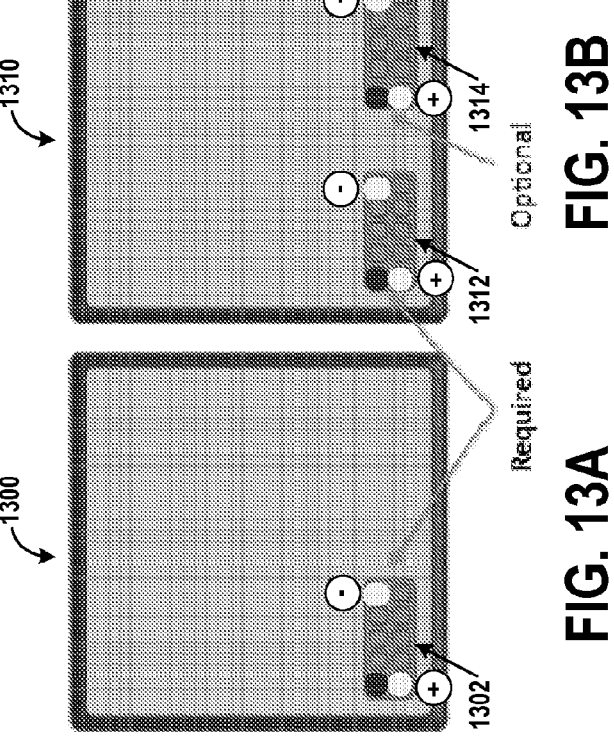
FIG. 13A illustrates an example configuration of a removable module in a larger square format.
FIG. 13B illustrates another example configuration of a removable module in a square format.

FIG. 13A illustrates an example configuration of a removable module 1300 in a larger square format. The module 1300 includes an interface block 1302 arranged in a horizontal manner. FIG. 13B illustrates another example configuration of a removable module 1310 in a square format. The module 1310 includes two interface blocks 1312 and 1314 arranged horizontally. For the rectangular module shown in FIGS. 13A-B, one interface block is required. The arrangement shown in FIG. 13B illustrates an optional configuration in which two pads may be provided for additional functionality depending upon details of the electronics of the module 1310, for example. The two interface blocks 1312 and 1314 are configured in a side-by-side configuration such that respective capacitive pads, power contact pads, and ground contact pads are in rows and columns, and the power (positive) contact pads of the interface blocks 1312 and 1314 are in the same row. Similarly, the ground (negative) contact pads of the interface blocks 1312 and 1314 are in the same row.

In FIGS. 13A-13B, the interface blocks are described as being arranged horizontally on the modules, however, such an arrangement may be dependent upon how the module is positioned. The interface blocks are arranged along a length of the modules, and since the modules are square, the interface blocks may be considered arranged vertically or horizontally depending upon a position of the module.

In FIGS. 11-13, interface blocks are provided such that the modules may couple to the backplane without any plugs or other types of physical interfaces or connectors. The capacitive data pads enable a flat form factor for the modules, and the power pads may include push pins for solid contact to transfer power.

Figure 14A:
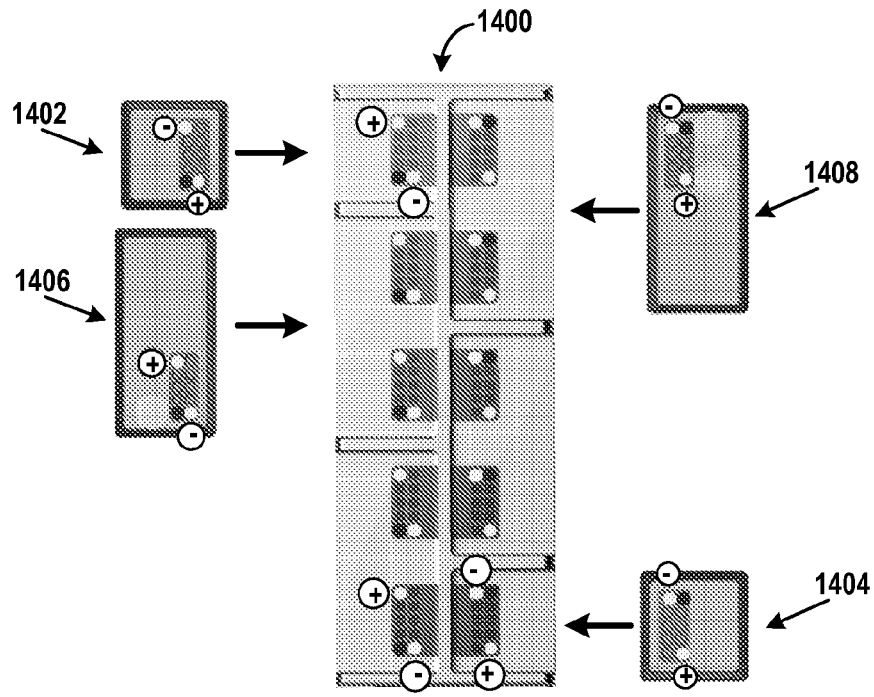
FIGS. 14A-14B illustrate example placement of modules into backplanes of multiple configurations.
Figure 14B:
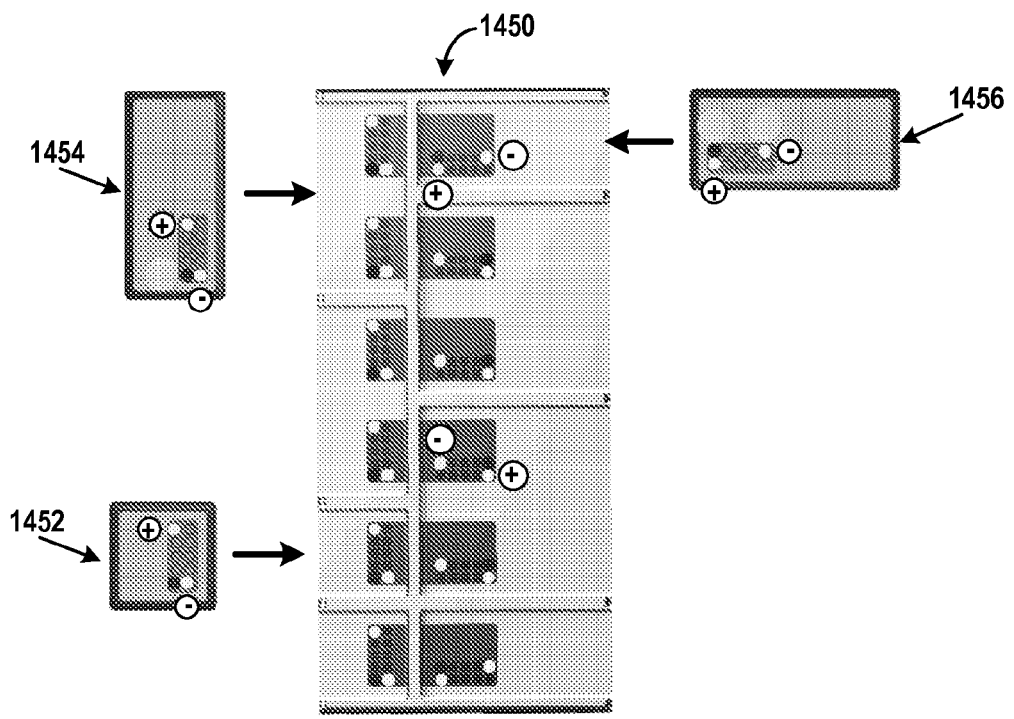

FIGS. 14A-14B illustrate example placement of modules into backplanes of multiple configurations. In FIG. 14A, a small configuration backplane 1400 is shown, and a view of interface blocks is provided through a transparent module top (opposed to viewing a bottom of the modules). In this example illustration, modules would be inserted as aligned (opposed to being flipped over and inserted). A 1×1 module 1402 may be inserted into any of the 1×1 slots. The example illustration shown is a view looking through the module to see a placement of pads on an underside surface. The 1×1 module 1402 may be universal and interface blocks may be positioned on a backside of a surface of the module 1402 such that the interface blocks may couple to the interface blocks of the backplane 1400 and power pads line up appropriately. Another 1×1 module 1404 is shown as well being inserted into another 1×1 slot. In addition, 1×2 modules 1406 and 1408 are shown being inserted into 1×2 slots.

When a module is inserted into a slot on the backplane by sliding horizontally into the slot, it is desired to have a ground pin connect first before a power pin connects, such that the module is grounded prior to receiving power. Similarly, when a module is removed, it is desired to have the ground pin break connection from the backplane last after removing power. Thus, the power pins are arranged on an underside of the modules in a configuration and size that enables the ground pin to connect first before power during insertion, and to break last after removing power during removal. Furthermore, it is desirable to avoid drag power pins across other capacitive pads on the computing device during insertion. To enable connections, the pads slide over corresponding pads on the computing device in a horizontal manner.

As described in relation to FIG. 13, power contact pad and ground contact pads are positioned on the modules, such as on the module 1404, such that insertion of the module 1404 into the respective slot causes the ground contact pad of the module 1404 to contact to the ground contact of the backplane 1400 first and then the power contact pad of the module 1404 to contact to the power contact of the backplane 1400. In addition, removal of the module 1404 from the respective slot causes the power contact pad of the module 1404 to disconnect from the power contact of the backplane 1400 first and then the ground contact pad of the module 1404 disconnects from the ground contact of the backplane 1400. Enabling the ground to connect first and break last provides safety precautions such that the module is always grounded and does not receive power until a ground if first established.

The size, configuration, and placement of the ground, power, and data contact pads on the modules also enable the power contact pad of the module 1404 to avoid contact with capacitive data pads of the interface block of the backplane 1400 during insertion and removal of the module 1404. Since the power contact pad is located in a corner and is last to connect, the power contact pad will not be dragged across any data pads during insertion or removal of the module.

In FIG. 14B, a medium configuration backplane 1450 is shown. As above, a 1×1 module 1452 is shown being inserted into a 1×1 slot, and a 1×2 module 1454 is shown being inserted into a 1×2 slot. The medium configuration backplane 1450 may also include 1×2 slots in a horizontal configuration, and the 1×2 module may be rotated to fit into the slot so that the power pins line up appropriately. Another 1×2 module 1456 is shown as being inserted into a horizontal 1×2 slot. Thus, 1×2 modules can fit vertically or horizontally into vertical or horizontal slots by rotating the module so that the power pins line up appropriately.

The modules may be configured to be inserted into a slot in a specific orientation. Due to placement of the pads, the modules may be used in multiple configurations of the device by rotating the modules into appropriate slots. For example, on the small size device, a 1×1 module may be rotated 180 degrees to be used on the other side of the spine, and on a medium size device, a 1×2 module may be rotated 90 degrees to be used on either side. The interface blocks may not be centered on the modules, but rather may be biased to a side.

In the examples shown in FIGS. 14A-14B, the power pad is last to connect, whether the module is inserted vertically or horizontally (in two different orientations). The ground and power contact pads on the modules are in opposite corners, and the ground pad can be larger than the power pad to cause the ground to connect first and break last.

In some examples, the modules may be configured to transfer data through the backplane using a D-PHY/M-PHY physical layer specification. D-PHY may be configured to use four capacitive data pads per lane (bi-directional) while M-PHY may be configured to use two capacitive data pads per lane (bi-directional). In other examples, the modules may be configured to transfers data based on the UniPro specifications, USB or PCIe. The backplane may further include a microcontroller or FPGA (not shown) that communicates with the backplane via the capacitive pads on the bottom of the modules.

In other examples, the modules and backplane may include optical data contacts, and each may be configured to transfer data using an optical data transfer. Still other data transfer methods are possible as well, such as a high-frequency RF (e.g., 60 GHz) in which instance the backplane and modules may be configured to include receivers and transmitters, or near-field inductive communication could be used as well to enable wireless transmission of data between coils within the backplane and modules.

FIG. 15 illustrates a side view of an example device in which modules have been inserted. As shown in FIG. 15, once inserted, the modules may be configured to provide a smooth and flat form factor for the device. In some examples, the backplane may have a horizontal and a vertical dimension, and slots are arranged to receive the modules such that the modules are constrained to be within the horizontal and vertical dimension. In other examples, modules may be allowed to violate the dimensional constraints of the backplane.

FIG. 16 illustrates a portion of an example device in which a module exceeds a thickness dimension of the device. For example, a number of modules are shown inserted into the backplane, and a module 1600 is shown as exceeding a thickness dimension, or "Z" direction dimension of the device. The module 1600 may include a camera with a z-axis expansion, for example.

FIGS. 17A-17B illustrate an example device in which a module exceeds a length dimension of the device. FIG. 17A illustrates a number of modules inserted into the backplane, and a module 1700 is shown exceeding a length of the device. The module 1700 may be a pulse oximeter module with a y-axis expansion. FIG. 17B illustrates example use of the module 1700.

Modules may be placed into any slot in which the module fits. In some examples, it may be desirable for some modules to be placed at certain positions of the device. For example, for modules that emit a certain amount of radiation, such modules may be positioned at a bottom of the device. In addition, in other examples, for modules that include antennas, such modules may be positioned to be toward a perimeter of the device to lower an amount of possible interference with other modules or components of the device.

Any number or type of modules may be used and inserted into devices described herein. In addition, some modules may be duplicates, or in other words, multiples of existing modules may be provided within a given device, such as multiple batteries, for example. In yet other examples, a slot of the device may be filled with a blank module, which may be a cosmetic module or a module that does not include any electronics that are configured to perform any functionality so as to fill all slots of the device. A few examples are described below.

In one example, a display module may be inserted into a slot on the front side or back side of the backplane. The display module may include an active matrix organic light emitting diode (AMOLED) display with an integrated controller. The display module may be driven a GPU in a display module microcontroller using the MIPI DSI-1 interface over MIPI D-Phy. The display module may include capacitive volume up-down buttons on a left-top side of the display module, and a power button on the right-top side of the display module. The display module may further include a microphone, for example.

Another example module includes a media module. The media module may include a microphone and a speaker, and also a 3.5 mm headphone jack, for example.

Another example module may include a battery module that is configured to provide a nominal open-circuit voltage of about 3.2V±0.2V. The battery module may have a nominal charging voltage of 3.6V±0.2V. The battery module may include a lithium polymer battery, and may also include a switching converter to power a 3.3 V bus, for example.

Another example module may include an application processor. The application processor may be configured to operate according to an operating system (OS), and may have a M-PCIe/UniPro interface. The application processor module may further include a micro SD card slot, for example.

Another example module may include a communication module that includes an antenna configured to be compliant with a service provider and regulatory requirements (e.g., cellular communications). The communication module may further include a Wifi module (or the Wifi module may be a separate module) that includes functionality for wireless communications according to IEEE 802.11b, for example.

Another example module includes a USB connector module, which may include a micro-B USB connector. Still other example modules may include a thermal imaging camera or a pulse oximeter module.

Still further example modules or functions of modules may include any of the following (or combinations of any of the following): a digital voltmeter or ammeter, a soil tester, an automotive diagnostics port reader, an ultrasound module, a motion detector, an alarm, a car key fob, an RFID card simulator, a fingerprint reader, a secondary secure corporate phone processor, a secure data modem, a smartcard/secure payment token, a cryptographic key store (for signing and decrypting email/messages), a satellite phone radio, a PA system driver, a megaphone, an environment monitor (e.g., carbon monoxide), a fire detector or fire alarm, a cigarette lighter or other heater device, a high intensity signal light source, a TV remote or IR blaster, a phone remote control (music and photography), an FTIR spectrometer, a mass spectrometer, a blood glucose meter, an air pressure gauge, a Geiger counter, a galvanic skin response sensor, a hot-wire anemometer, a humidity sensor, an impedance spectrometer, a spectrophotometer, a Breathalyzer, a microfluidic module, a water oxygen content or salinity detector, a laser Level, a hall effect sensor, a radar gun, a smoke detector, an olfactometer, an altimeter, a LIDAR, a light/color meter for photography, a magnetometer, a USB connector, an RJ-11 analog phone jack, an Ethernet port, an RS-232 port, an SMA connector with Gigasample ADC, a thermocouple port, an infrared camera, a digital microscope, a rangefinder, an SLR camera, an IR imager, a 3D scanner, a high-speed camera (1000+ FPS), an E-Ink display, a twisted-nematic display and phone keypad, a touchscreen LCD, VGA (output display), an HDMI I/O, a component I/O, a composite I/O, a video projector, a laser projector, a fuel cell battery, a battery, a solar panel, a mechanical motion inductor, a GPS, a GSM radio, a CDMA radio, a Wifi Radio, AM/FM/XM Radio, an FM Radio Transmitter, a low-frequency software defined radio, a VHF (Marine), a CB Radio, a processor, inductive charging module, a multi-SIM capable module, a long range antenna, a gesture tracker, a secondary/backup battery, a satellite phone antenna, a docking station connector, an ultraviolet lamp, a weather station, a polygraph tester, a disco light, a custom geometry LED indicator light, a laser pointer, a removable battery-powered lapel microphone, an emergency locator beacon, a mass data storage, a parole enforcement, a building/vehicle access token, a loudspeaker, a UV light source, a voice recognition hardware acceleration/data, a language translation hardware acceleration/data, a credit card swiper, a high-atmosphere balloon Internet radio, high-speed IrDA, a 3D printer, a drum pad, an underwater camera, a fish finder, a high-quality microphone, a model railroad controller, a sketch pad screen with stylus, an optical output, an Endo connection adapter (1×2 slot to 1×2, etc.), a guitar pedal, an audio processing module, a pregnancy tester.

Figure 18:
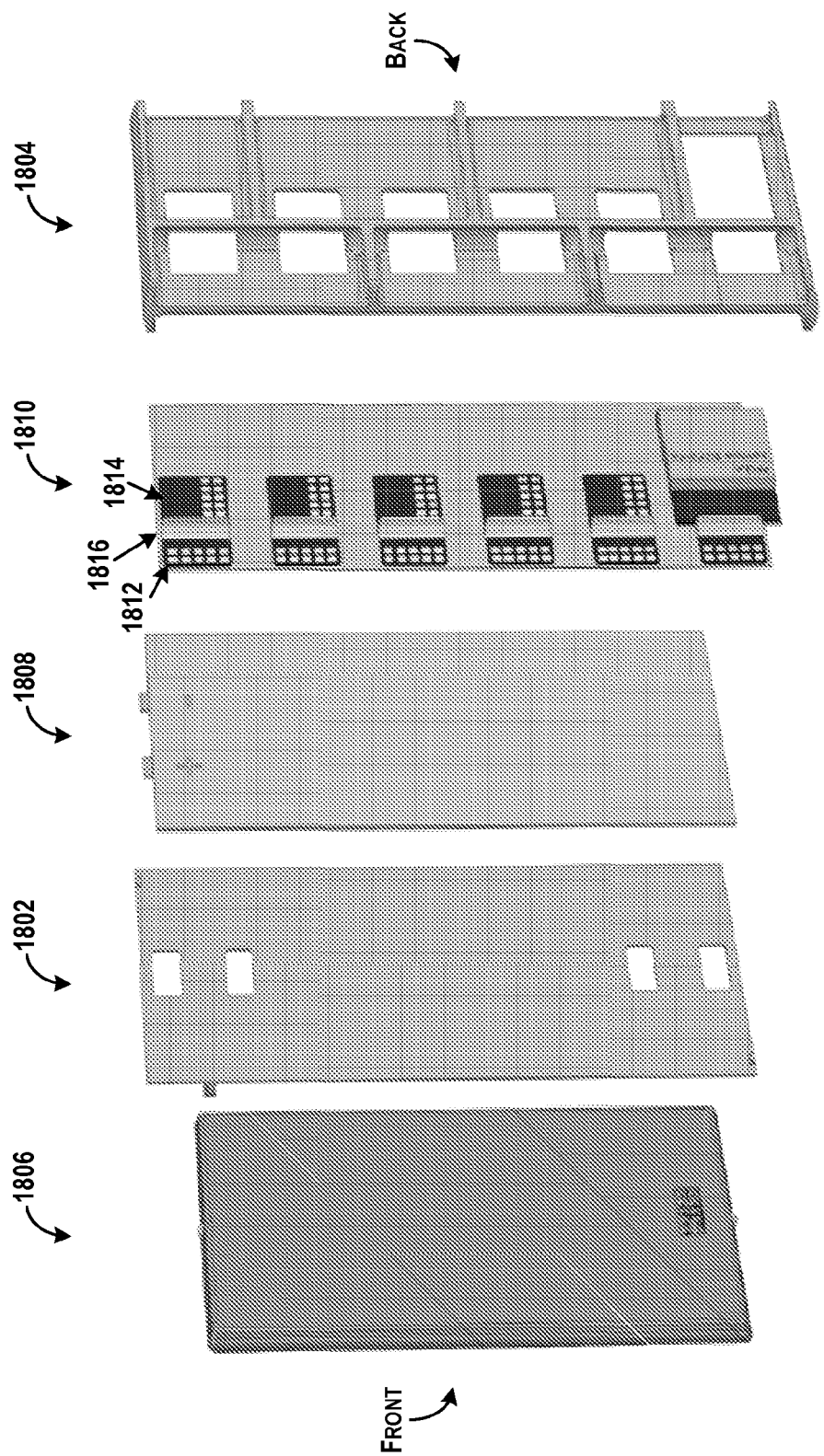
FIG. 18 illustrates an expanded view of an example device.

FIG. 18 illustrates an expanded view of an example device. The device is shown with a backplane that comprises a front backplane 1802 and a back backplane 1804. The front backplane 1802 may include horizontal rails, as described previously in FIGS. 3A-3C, and the back backplane 1804 may include a spine and a number of horizontal ribs, as described previously in FIGS. 2A-2C. A display module 1806 may couple to the front backplane 1802.

The front backplane 1802 may couple to the back backplane 1804 through a battery layer 1808 and a printed circuit board 1810. The battery layer 1808 may provide power for the structure as well as act as a heat sink to dissipate heat generated by displays and electronics on the printed circuit board 1810. The battery layer 1808 provides power to allow for removal and insertion of modules without powering down the device. The printed circuit board 1810 may include interface blocks, such as interface blocks 1818 and 1814, and metal inserts between adjacent interface blocks, such as metal insert 1816. The back backplane 1804 may include openings within slots such that the printed circuit board 1810 couples to the back backplane 1804 and content pad for the slots are inserted into the openings of the back backplane 1804 within the slots.

In some examples, the front backplane 1802 and the back backplane 1804, as well as the battery layer 1808 and the printed circuit board 1810, may be considered a backplane for the device that includes a front side and a back side. Within examples, the backplane may thus refer to a skeleton or base structure of the device, and not necessarily the back or rear-facing portion of the device since the device also supports front-facing modularity as well.

Within examples, the back backplane 1804 comprises a metal (e.g., aluminum), and the metal housing enables heat to transfer from the modules to the housing to dissipate out of the modules and into the back backplane 1804, so that the back backplane 1804 acts as a heat sink.

Figure 19:
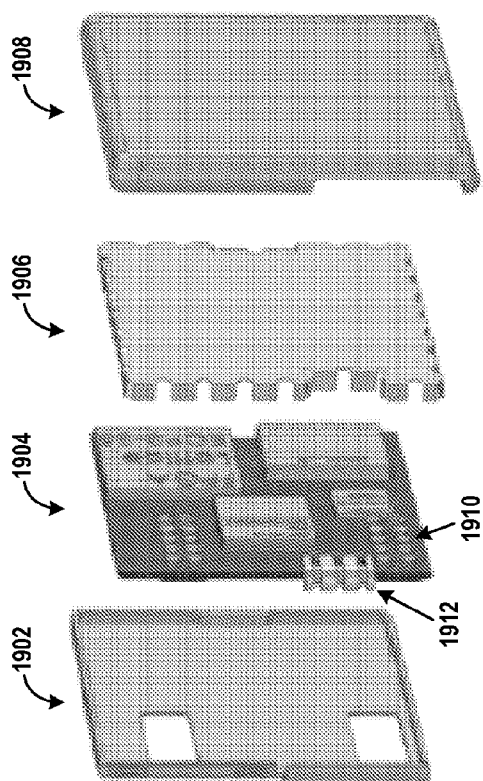
FIG. 19 illustrates an expanded view of an example module.

FIG. 19 illustrates an expanded view of an example module. The module includes a back cover 1902, an electronics board 1904, a shielding layer 1906, and a front cover 1908. The front cover 1908 may be customized to include any type of graphics or aesthetic design, and may be replaced as well. The shielding layer 1906 protects the electronics board 1904 while the front cover 1908 is removed. The shielding layer 1906 further enables all modules to behave similarly for radio frequency (RF) emissions and helps for antenna design, for example. In some examples, the module may further include a thin pad of conductive foam (not shown) on a bottom of the module to fill space and enable a snug fit into a slot, as well as to reduce transmission of radiation.

The electronics board 1904 includes power pins and data transfer pins 1910, as well as an electro-permanent magnet 1912, and may also include other data transfer interfaces (e.g., capacitive data pads or optical transfer interfaces). The electro-permanent magnet 1912 may be activated to hold the module into place within a device.

Figure 21:
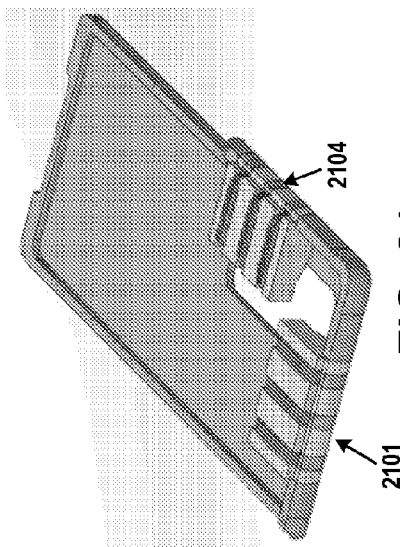
FIGS. 20-21 illustrate portions of a module with an electro-permanent magnet.
Figure 20:
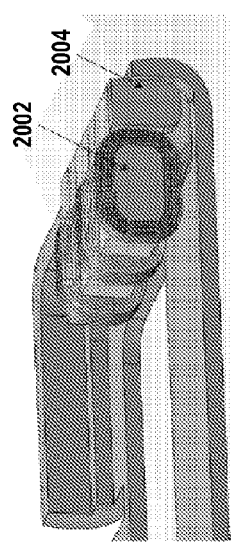

FIGS. 20 and 21 illustrate portions of a module including an electro-permanent magnet. The electro-permanent magnet does not require constant power, but rather, a voltage pulse is provided to electro-permanent magnet for activation and then the electro-permanent magnet is permanently magnetic in that state. The electro-permanent magnet can be provided another voltage pulse to de-magnetize the electro-permanent magnet. Thus, the electro-permanent magnet is a type of magnet that includes both an electromagnet and a permanent magnet and in which a magnetic field produced by the electro-magnet is used to change a magnetization of the permanent magnet. The permanent magnet includes magnetically hard and soft materials, of which only the soft material can have its magnetization changed. When the magnetically soft and hard materials have opposite magnetizations the magnet has no net field, and when the magnetically soft and hard materials are aligned the magnet displays magnetic behavior.

In FIG. 20, an electro-permanent magnet includes a copper wire coil 2002 and magnetic material 2004. An H-Bridge comprised from six discrete MOSFET transistors drives the magnets, which are wired in series. Four of the transistors are wired as an H-bridge, and the other two provide the gate drive. Four microcontroller GPIO pins are used to control the H-bridge. The magnets can be driven with 26 Volts DC (as a 50 microsecond, 10 ampere pulse) which may be stored in a tantalum capacitor.

In FIG. 21, an example module is shown to include two electro-permanent magnets 2101 and 2104. For example, rear-mounted modules (e.g., 1×2 or 2×2 modules) may include two electro-permanent magnets that may be activated to mechanically attach/release the module to steel inserts on the backplane under software control. A short positive-voltage pulse turns on magnetic holding, and a short negative-voltage pulse turns off holding. No quiescent power is needed in either the holding or released state.

Figure 22:
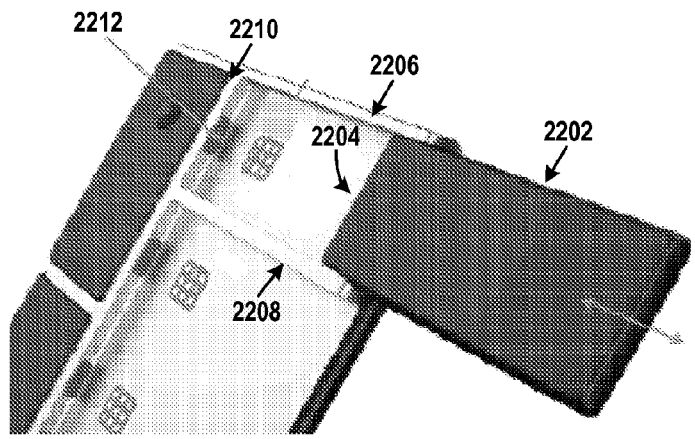
FIG. 22 illustrates a portion of a device in which a module is secured to the device via an electro-permanent magnet.

FIG. 22 illustrates a portion of a device in which a module is secured to the device via an electro-permanent magnet. A module 2202 includes an electro-permanent magnet 2204 and may be inserted into a slot formed by rails 2206 and 2208 and a spine 2210. The module 2202 may slide into the slot such that the module 2202 fits within grooves of the rails due to a curved radius of a perimeter or sides of the module and an opposite curvature being present in the rails 2206 and 2208.

A metal insert 2212 is included in the spine 2210 within a slot, and is configured to line up with the electro-permanent magnet 2204 of the module 2202 when the module 2202 is inserted into the slot. The device may include a built-in battery (not shown), that is separate from a battery module, which provides power for switching the electro-permanent magnet 2204 of the module 2202 (and possibly also provides reserve power for the device). The device may include a built-in battery to enable any battery module of the device to be removed, and also enable other modules to be removed and inserted by activation of electro-permanent magnets.

Within examples, the metal insert 2212 is configured to secure the module 2202 within the slot via a received magnetic force from the electro-permanent magnet 2204.

In FIG. 22, an interface block with pads is shown on the device and the interface block includes an alternate arrangement of the pads that may be used in some designs.

Figure 23:
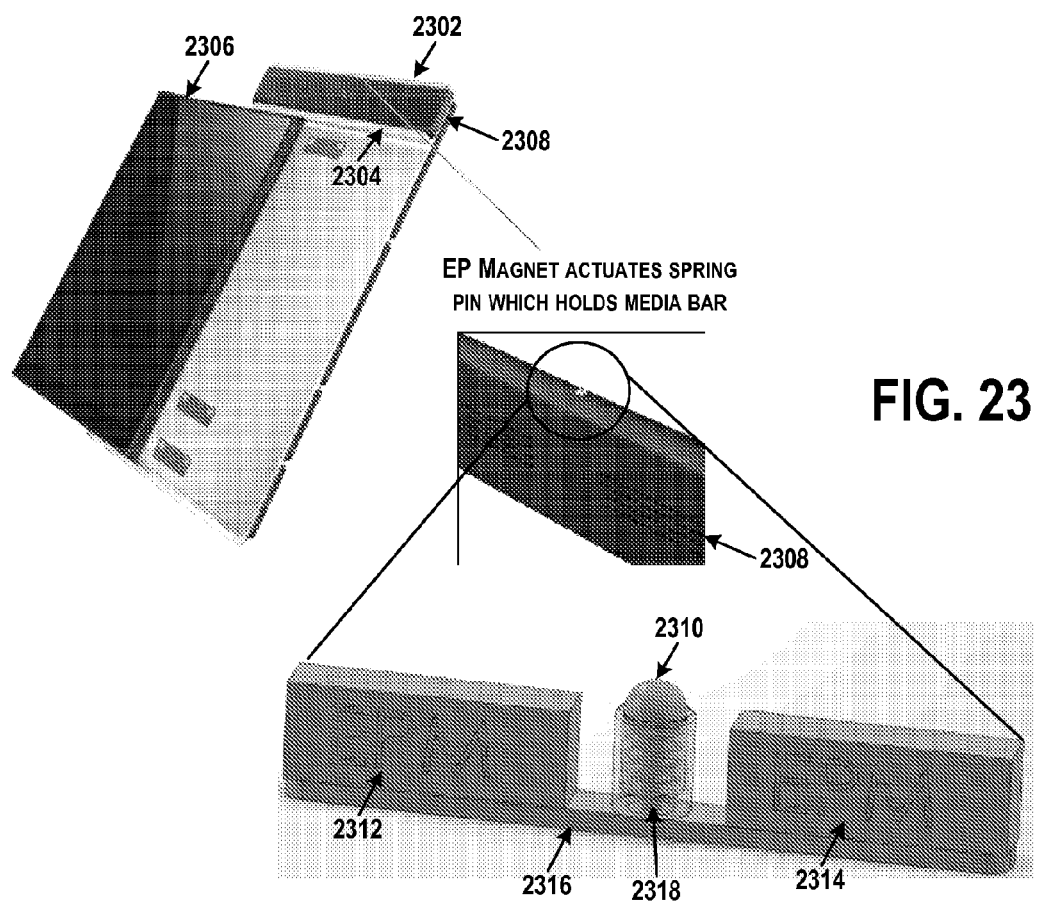
FIG. 23 illustrates portions of a device in which a module is secured to the device.

FIG. 23 illustrates portions of a device in which a module is secured to the device. A front side of the device is shown. On a front side, a backplane does not include a spine extending along a length of the device, and thus, metal inserts may not be present for the modules to lock onto via an electro-permanent magnet. The front side does include rails, for example, such as rails 2302 and 2304. The rails 2302 and 2304 include grooves into which a front side module, such as display module 2306 or media module 2308, may slide into to secure to the backplane.

In addition, modules may include other mechanisms to lock into the device. For example, the module 2308 may include a ball spring 2310 that is configured to compress into the module 2308 during insertion of the module 2308 to the front side of the backplane and to extend into a corresponding opening within the rail 2302 of the backplane based on force from the spring to secure the module 2308 into position on the front side of the backplane. The module 2308 may further include electro-permanent magnets 2312 and 2314 coupled to the ball spring 2310, and when the module 2308 is inserted into the device, the electro-permanent magnets 2312 and 2314 may be activated to cause the ball spring to remain extended into the corresponding opening within the front side of the backplane. For example, the electro-permanent magnets 2312 and 2314 may force a base 2316 that is coupled to a pin 2318 internal to the ball spring 2310 to push the pin 2318 upward forcing the ball spring 2310 against the rail 2302. Thus, the ball spring 2310 is forced into the corresponding opening or divot in the rail 2302 which prevents the module 2308 from being removed from the device.

In some examples, the module 2308 may be configured to enable data transfer to the device via the pin 2318 of the ball spring 2310 in addition to or alternatively from the data pad on an underside surface of the module 2308.

In FIG. 23, another interface block with pads is shown on the device and the interface block includes an alternate arrangement of the pads that may be used in some designs.

Within examples, the device may be configured to provide rear-facing modularity, front-facing modularity, or both to enable modules to be positioned on a front and/or back of the device. As described, modules positioned on a backside of the device may be configured to lock in place using electro-permanent magnets, and modules on a frontside of the device may be configured to lock in place using a ball spring. In other examples, modules on the backside of the device may also or alternatively be configured to lock in place using a ball spring, and modules on the frontside of the device may also or alternatively be configured to lock in place using the electro-permanent magnet configuration. Thus, modules may include one or both of the magnetic and mechanical mechanism to lock in place. Also, modules may be interchangeable and may be positioned on a frontside or a backside of the device depending on a slot configuration of the device, for example.

In one example, a module may include an accelerometer or other inertial measurement unit (IMU), and may be configured to communicate with all other modules of the device. The accelerometer module may be configured to detect changes in acceleration due to the device falling, for example. Based on a detected change in acceleration that exceeds a threshold, the accelerometer module may be configured to cause the backplane to eject all modules. In some examples, modules may be ejected by de-magnetizing the electro-permanent magnets. In other examples, the modules may be ejected by causing the electro-permanent magnets to be magnetized in an opposite polarity that pushes the modules out.

It should be understood that arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location, or other structural elements described as independent structures may be combined.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims, along with the full scope of equivalents to which such claims are entitled. It is also to be understood that the terminology used herein is for the purpose of describing particular embodiments only, and is not intended to be limiting.

What is claimed is:

1. A module comprising:
   a housing, wherein the housing comprises an enclosed structure with a top side and a bottom side;
   multiple capacitive pads, wherein each capacitive pad includes data contacts to enable data transfer;
   a power contact pad to provide or receive power; and
   a ground contact pad to couple to ground, wherein the ground contact pad is larger in size than the power contact pad such that when the module is inserted into a slot of a computing device, the ground contact pad couples to the ground prior to the power contact pad providing or receiving power;
   wherein the multiple capacitive pads, the power contact pad, and the ground contact pad are provided on and co-planar with an exterior surface of the bottom side of the housing such that the module can be slid into the slot of the computing device.

2. The module of claim 1, wherein the ground contact pad is positioned closer than the power contact pad to an edge of the bottom side of the housing that is configured to be first inserted into the slot of the computing device.

3. The module of claim 1, wherein the multiple capacitive pads, the power contact pad, and the ground contact pad are configured in rows, and wherein the power contact pad is positioned at a corner.

4. The module of claim 1, wherein the multiple capacitive pads, the power contact pad, and the ground contact pad are configured in rows, and wherein the power contact pad is in a corner and the ground contact pad is in another corner diagonal and across from the power contact pad.

5. The module of claim 1, further comprising an interface block on which the multiple capacitive pads, the power contact pad, and the ground contact pad are provided.

6. The module of claim 5, wherein the housing has perimeter structure with an opening, and wherein the interface block is provided adjacent the opening.

7. The module of claim 5, wherein the interface block is a first interface block, and the module further comprises:
   a second interface block including multiple capacitive pads, a power contact pad, and a ground contact pad.

8. The module of claim 7, wherein the first interface block and the second interface block are configured in a side-by-side configuration such that respective capacitive pads, power contact pads, and ground contact pads are in rows and columns, and the power contact pads of the first interface block and the second interface block are in the same row.

9. The module of claim 7, wherein the first interface block and the second interface block are configured in a stacked configuration such that respective capacitive pads, power contact pads, and ground contact pads are in rows and columns, and the power contact pads of the first interface block and the second interface block are in the same column.

10. A module comprising:
    a housing, wherein the housing comprises an enclosed structure with a top side and a bottom side;
    a first interface block comprising;
       multiple capacitive pads, wherein each capacitive pad includes data contacts to enable data transfer;
       a power contact pad to provide or receive power; and
       a ground contact pad to couple to ground, wherein the ground contact pad is larger in size than the power contact pad, wherein the multiple capacitive pads, the power contact pad, and the ground contact pad are configured in rows, and wherein the power contact pad is in a corner and the ground contact pad is in another corner diagonal and across from the power contact pad;
       wherein the multiple capacitive pads, the power contact pad, and the ground contact pad of the first interface block are provided on and co-planar with an exterior surface of the bottom side of the housing such that the module can be slid into the slot of the computing device; and
    a second interface block comprising;
       multiple capacitive pads, wherein each capacitive pad includes data contacts to enable data transfer;
       a power contact pad to provide or receive power; and
       a ground contact pad to couple to ground;
       wherein the multiple capacitive pads, the power contact pad, and the ground contact pad of the second interface block are provided on and co-planar with the exterior surface of the bottom side of the housing such that the module can be slid into the slot of the computing device.

11. The module of claim 10, wherein the first interface block and the second interface block are configured in a side-by-side configuration such that respective capacitive pads, power contact pads, and ground contact pads are in rows and columns, and the power contact pads of the first interface block and the second interface block are in the same row.

12. The module of claim 10, wherein the first interface block and the second interface block are configured in a stacked configuration such that respective capacitive pads, power contact pads, and ground contact pads are in rows and columns, and the power contact pads of the first interface block and the second interface block are in the same column.

13. A computing device comprising;
    a plurality of slots to receive modules;
    an interface block within slots of the plurality of slots, wherein the interface block includes a power contact to provide power to a respective module and a ground contact to couple ground to the respective module; and
    a plurality of removable modules to be positioned into the plurality of slots, wherein a respective removable module comprises:
       a housing, wherein the housing comprises an enclosed structure with a top side and a bottom side; and
       a module interface block to couple to the interface block within a respective slot, wherein the module interface block includes a power contact pad and a ground contact pad, and wherein the power contact pad and the ground contact pad are positioned such that insertion of the respective removable module into the respective slot causes the ground contact pad to contact to the ground contact first and then the power contact pad to contact to the power contact;

wherein the power contact pad and the ground contact pad are provided on and co-planar with an exterior surface of the bottom side of the housing such that the respective removable module can be slid into the respective slot of the computing device.

14. The computing device of claim 13, wherein removal of the respective removable module from the respective slot causes the power contact pad to disconnect from the power contact first and then the around contact pad disconnects from the ground contact.

15. The computing device of claim 13, wherein the ground contact pad of the module interface block is larger in size than the power contact pad.

16. The computing device of claim 13, wherein the module interface block of the respective removable module further includes multiple capacitive pads, wherein each capacitive pad includes data contacts to enable data transfer.

17. The computing device of claim 16, wherein the interface block also includes multiple capacitive pads positioned such that the power contact pad of the module interface block avoids contact with the multiple capacitive pads of the interface block during insertion and removal of the respective removable module.

18. The computing device of claim 13, wherein the removable modules slide horizontally into the plurality of slots, such that pads on the module interface block slide over corresponding pads on the interface block.

19. The computing device of claim 13, further comprising a front side having at least one slot to receive a module and a backside having the plurality of slots to receive the modules.

* * * * *